US012665044B2

(12) United States Patent
Jhawar et al.

(10) Patent No.: US 12,665,044 B2
(45) Date of Patent: Jun. 23, 2026

(54) TECHNIQUE TO ANALYZE AND REPORT ACCURATE DATA, SYNCHRONIZING MULTIPLE SIGNALS IN A MEMORY CHIP

(71) Applicant: Tektronix, Inc., Beaverton, OR (US)

(72) Inventors: Swapnil Jhawar, Rewa (IN); Chandra Sekhar Kappagantu, Bangalore (IN); Mahesha Guttahalli Lakshmipathy, Bengaluru (IN); Sriram Mandyam Krishnakumar, Bangalore (IN)

(73) Assignee: Tektronix, Inc., Beaverton, OR (US)

( * ) Notice: Subject to any disclaimer, the term of this patent is extended or adjusted under 35 U.S.C. 154(b) by 48 days.

(21) Appl. No.: 18/534,495

(22) Filed: Dec. 8, 2023

(65) Prior Publication Data

US 2024/0274222 A1     Aug. 15, 2024

(30) Foreign Application Priority Data

Dec. 14, 2022    (IN) .............................. 202221072283

(51) Int. Cl.
*G11C 29/56*          (2006.01)
(52) U.S. Cl.
CPC .. *G11C 29/56004* (2013.01); *G11C 29/56008* (2013.01); *G11C 29/56016* (2013.01)
(58) Field of Classification Search
CPC ........ G11C 29/56004; G11C 29/56008; G11C 29/56016; G11C 29/56; G11C 29/56012; G11C 29/26; G11C 2029/2602
See application file for complete search history.

(56) References Cited

U.S. PATENT DOCUMENTS

| | | | | |
|---|---|---|---|---|
| 7,724,017 B2 * | 5/2010 | Zhao | .................. | G01R 31/2621 |
| | | | | 324/762.01 |
| 2002/0173926 A1 * | 11/2002 | McCord | ........... | G01R 31/31926 |
| | | | | 702/120 |
| 2007/0297255 A1 * | 12/2007 | Arasawa | ................ | G11C 29/56 |
| | | | | 365/194 |

* cited by examiner

*Primary Examiner* — Mohammed A Bashar
(74) *Attorney, Agent, or Firm* — Miller Nash LLP; Andrew J. Harrington

(57)          ABSTRACT

A test and measurement system includes a multi-stack test subsystem including a plurality of test and measurement instruments, each instrument coupled to a device under test (DUT) to receive a plurality of test signals from the DUT during a test mode of operation. One test and measurement instrument is designated as a master and the remainder are designated as extension test and measurement instruments. The master communicates control signals to each of the extensions to synchronize the test and measurement instruments to simultaneously acquire the plurality of test signals provided by the DUT. An automation engine is coupled to the multi-stack test subsystem to receive the acquired plurality of test signals from the master, and the automation engine analyzes the acquired test signals to perform validation testing for each of plurality of test signals and simultaneously display results of the validation testing for the plurality of test signals.

18 Claims, 7 Drawing Sheets

FIG. 1

402
400
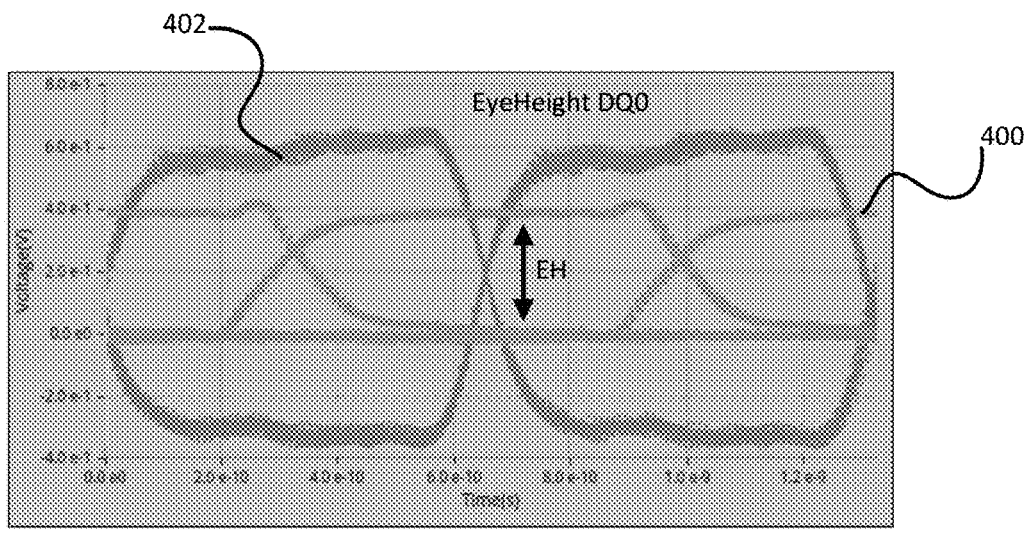
FIG. 4A
402
400
EyeWidth DQ0
EW
FIG. 4B
402
400
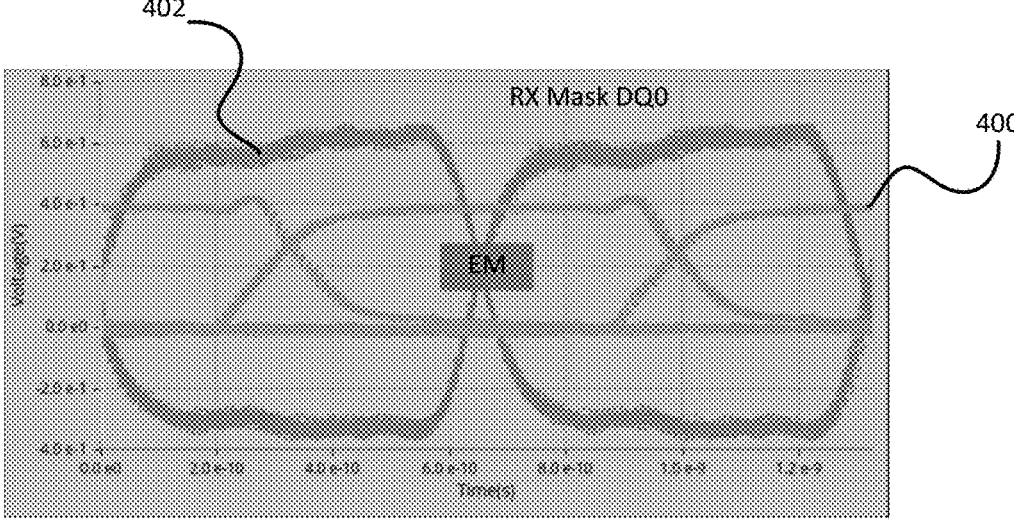
FIG. 4C

TECHNIQUE TO ANALYZE AND REPORT ACCURATE DATA, SYNCHRONIZING MULTIPLE SIGNALS IN A MEMORY CHIP

CROSS-REFERENCE TO RELATED APPLICATIONS

This disclosure claims benefit of Indian Patent Application No. IN 202221072283, titled "METHOD AND SYSTEM FOR PERFORMING PARALLEL PROCESSING OF MULTIPLE DATA SIGNALS IN MEMORY DEVICES," filed on Dec. 14, 2022, the disclosure of which is incorporated herein by reference in its entirety.

TECHNICAL FIELD

The present disclosure relates generally to validation testing of integrated circuits or semiconductor chips, and more particularly to methods and systems for synchronizing parallel capture of signals from a device under test (DUT) during validation testing.

BACKGROUND

Electronic devices are utilized in a wide variety of applications in industries such as automotive, industrial automation, telecommunications, and computer systems. Many of these electronic devices include some type of memory system to store firmware and software for system operation as well as for the storage of data such as for data acquisition, data logging, and myriad other applications. These memory systems may include one or more of a variety of different types of memory devices including dynamic random access memory (DRAM), static random access memory (SRAM), and the many variations of these two core types of memory devices such as synchronous DRAM (SDRAM), double data rate (DDR) SDRAM, quad data rate (QDR) SRAM, as well as others types of memory that may be suitable in particular applications. Many of these memories devices, such as DDR SDRAM, utilize a data strobe signal (DQS) signal that is communicated along with data signals DQ during operation of the device. The data strobe signal DQS is suitably aligned with transitions of the data signals DQ to enable a device receiving the DQ signals to properly capture these signals during read and write operations. During read operations, the DDR SDRAM provides the DQS and DQ signals on a data bus of the DDR SDRAM, and another electronic device, such as a processor, coupled to the data bus utilizes the DQS signal to capture the DQ signals. During write operations the DDR SDRAM receives the DQS signal and DQ signals being written from the processor and utilizes the DQS signal to capture the received DQ signals.

The testing of memory devices like DDR SDRAMs, as well as other types of memory devices and other types of integrated circuits that utilize a data bus including a data strobe signal DQS and data signals, is complicated by the multiple data signals DQ that need to be acquired along with the data strobe signal DQS. The device being tested, whether a memory device or other type of integrated circuit, may be referred to as a DUT in the present description. Existing test procedures typically capture or acquire the DQS signal along with one of the DQ signals at a time. Thus, only a pair of signals, namely the DQS signal and one DQ signal, is acquired at a time, which increases the time required to test and validate the proper operation of the DQS signal and all the DQ signals. Current DDR SDRAMs may, for example, include thirty-two (32) DQ signals. This test process may involve manually connecting selected DQ signals to a test port on a test and measurement instrument, such as an oscilloscope, further increasing the required test time and being prone to errors when forming new interconnections to each of data signal DQ. Variations in the DQS signal may occur during different occurrences of the generation of this signal, and thus this sequential approach of acquiring the currently generated DQS signal along with one of the DQ signals may experience errors due to variations in the sequentially generated DQS signal. For example, variations in temperature, supply voltage, and other operating parameters may result in variations in the sequentially generated DQS signal during testing. Moreover, while some current techniques may acquire more than one data signal DQ at a time along with the DQS signal, these techniques are limited and do not enable comprehensive validation testing desired by users of these memory devices or other integrated circuits.

There is a need for improved techniques of validation testing of memory devices and other integrated circuits that overcome at least some of the above-mentioned drawbacks experienced with conventional validation testing techniques.

BRIEF DESCRIPTION OF ACCOMPANYING DRAWINGS

Aspects, features and advantages of examples of the present disclosure will become apparent from the following description of examples in reference to the appended drawings in which:

FIG. 1 is a simplified functional block diagram of a test and measurement system including a multi-stack test subsystem including multiple test and measurement instruments that are synchronized for capturing parallel signals from a device under test (DUT) during validation testing of the DUT in accordance with some embodiments of the present disclosure.

Figure 1:
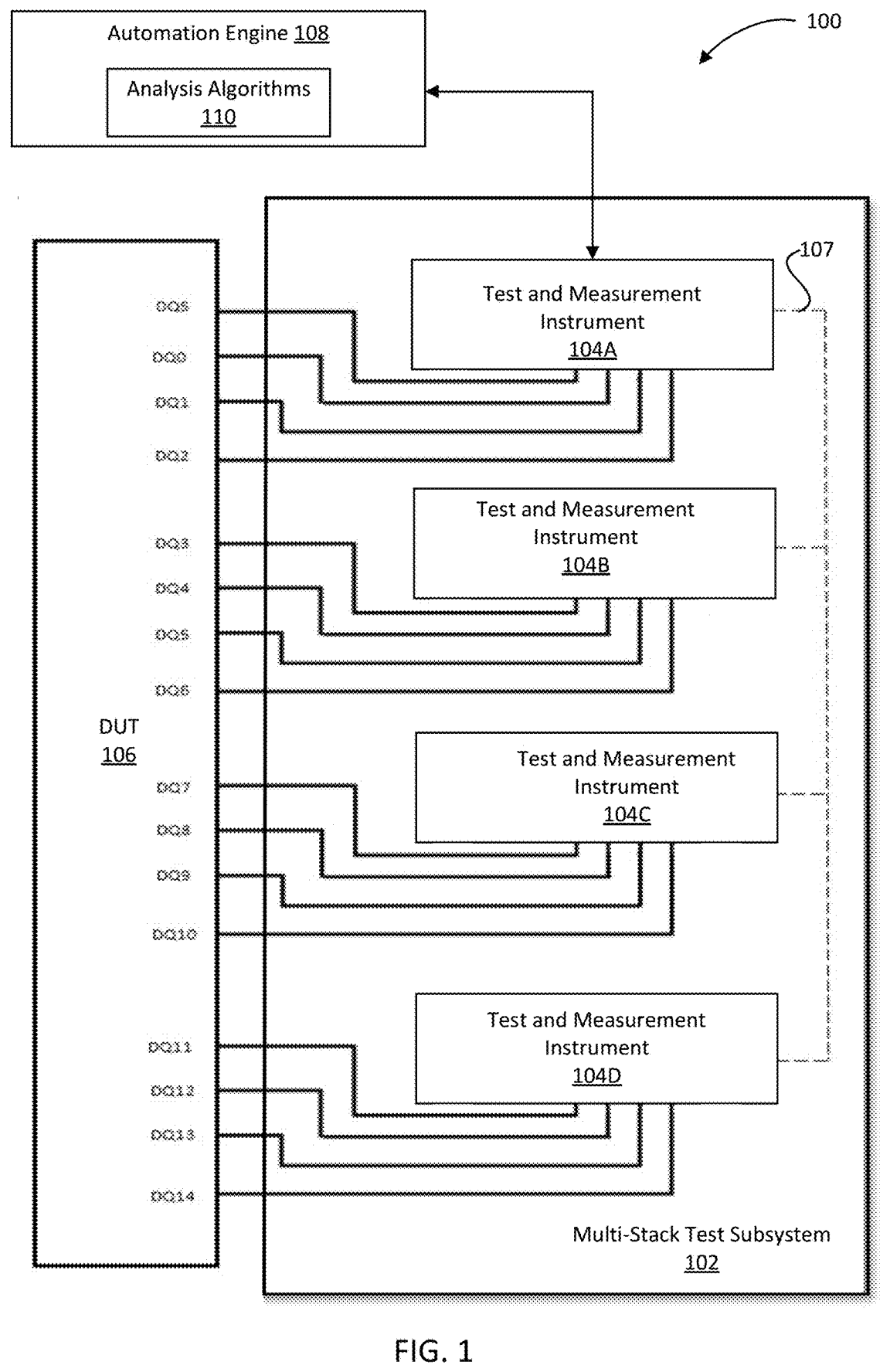
Figure 3:
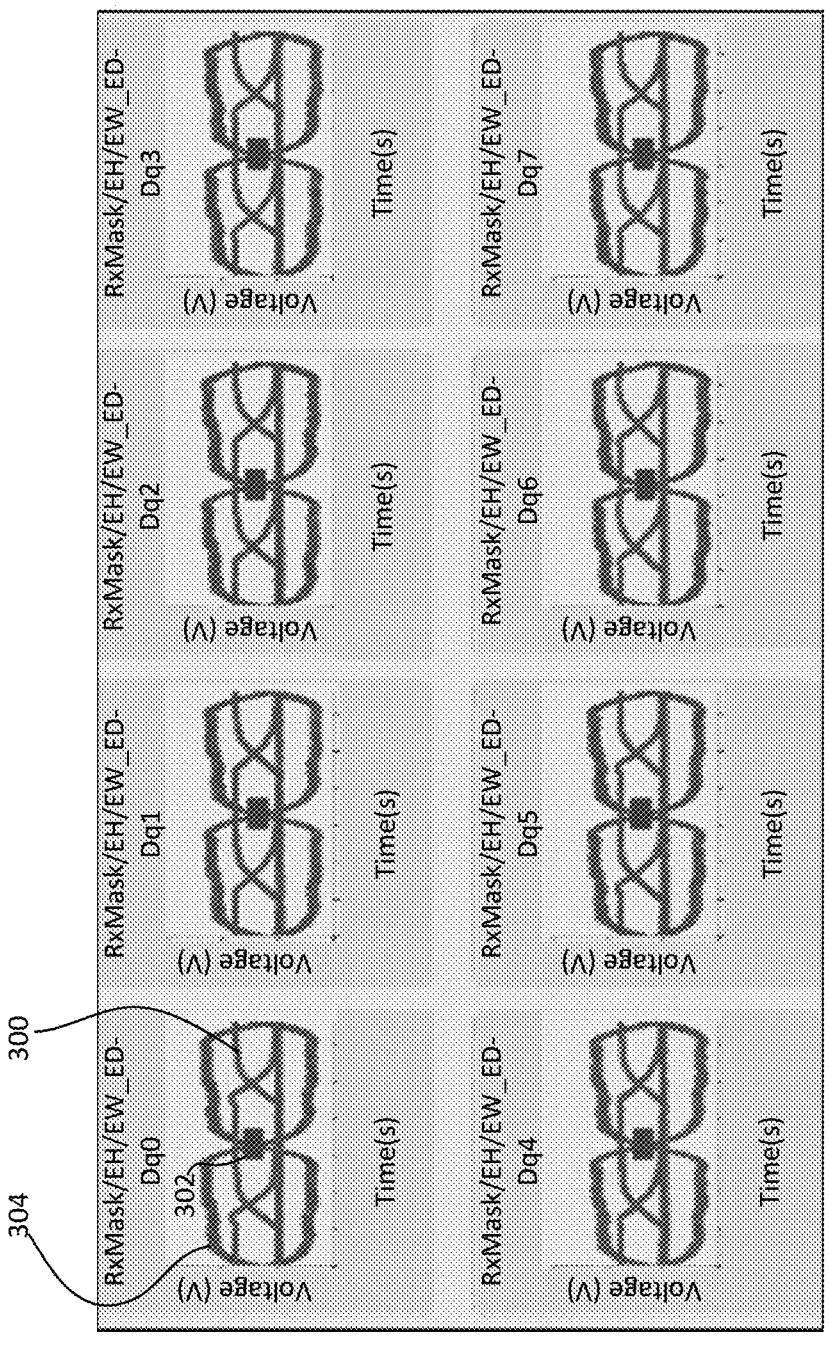
FIG. 3 shows example eye diagrams of data signals and a data strobe signal acquired by the multi-stack test subsystem and displayed by the automation engine of the test and measurement system of FIG. 1 in accordance with some embodiments of the present disclosure.

FIGS. 4A, 4B, and 4C are exploded eye diagrams of selected ones of eye diagrams of FIG. 3 to more clearly show eye diagram parameters that are calculated for the each of the data signals captured from the DUT of FIG. 1 in accordance with some embodiments of the present disclosure.

Figure 5:
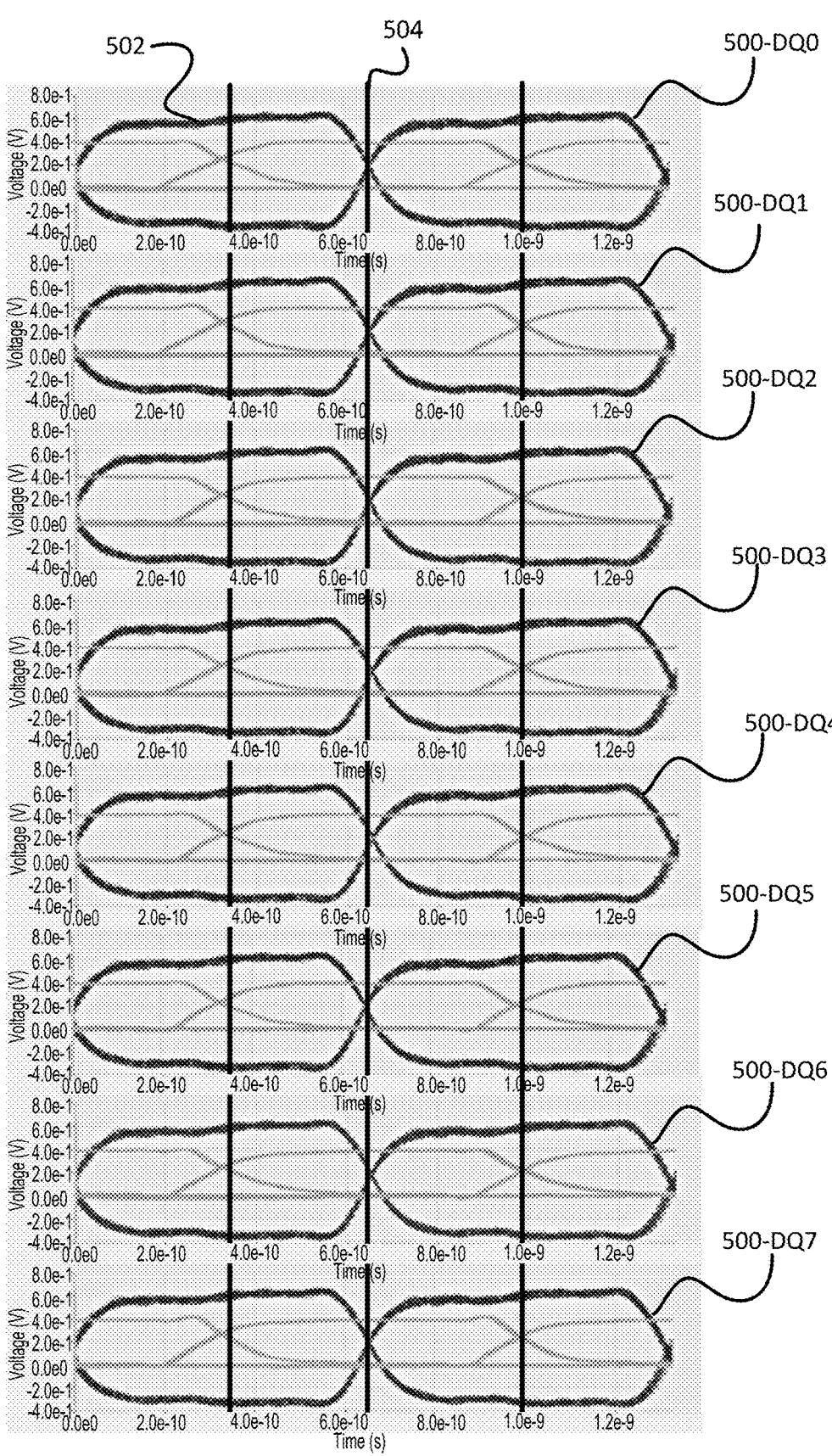

FIG. 5 illustrates eye diagrams showing skew between each of multiple data signals and a data strobe signal captured from the DUT of FIG. 1 in accordance with some embodiments of the present disclosure.

Figure 6:
Figures 7, 8:

FIGS. 6, 7, and 8 illustrate several exemplary graphical displays generated by an automation engine of the test and measurement system of FIG. 1 that provide a user with simultaneous information regarding whether parameters calculated for the data signals captured from the DUT pass or fail associated test criteria in accordance with some embodiments of the present disclosure.

It should be appreciated by those skilled in the art that any block diagrams herein represent conceptual views of illustrative methods embodying the principles of the present disclosure. Similarly, it will be appreciated that any flow charts, flow diagrams, and the like represent various processes which may be substantially represented in computer readable medium and so executed by a computer or processor, whether or not such computer or processor is explicitly shown.

DETAILED DESCRIPTION

Embodiments of the present disclosure utilize multiple test and measurement instruments to that are synchronized to capture or acquire, in parallel, multiple test signals from a DUT, and to analyze these acquired test signals to perform validation testing on the DUT and display to a user the results of this analysis. These test signals may, for example, be data signals DQ and a data strobe signal DQS of a memory device like a DDR SDRAM. In this way, methods and systems according to embodiments of the present disclosure enable a user to see, for each data signal of interest in the DUT, a status indicating whether the data signal has passed or failed a corresponding validation test. This simplifies the testing process for the user, eliminating the need for sequential acquisition of data signals of interest and errors that may be introduced by such sequential acquisition, as well as eliminating the need for manual reconfiguration of the test system and the accompanying errors that may result. The user gets to see whether a given DUT passes validation tests in single test cycle of the DUT, where a test cycle is the time during which the system acquires test signals from the DUT, analyzes these acquired signals, and displays the results of this analysis to the user. This reduces the time required to test the DUT. A user may, however, perform multiple test cycles on a given DUT and take actions to compensate or adjust characteristics of respective test signals that fail the validation tests. After taking suitable corrective actions, the user may once again perform validation tests on the DUT to see if these actions correct the test signal or signals that initially failed the validation tests.

FIG. 1 is a simplified functional block diagram of a test and measurement system 100 including a multi-stack test subsystem 102 including multiple test and measurement instruments 104A-104D that are synchronized for capturing parallel test signals from a device under test (DUT) 106 during validation testing in accordance with some embodiments of the present disclosure. The multi-stack test subsystem includes a number N of test and measurement instruments 104A-D, where N=4 in the example embodiment of FIG. 1. Other embodiments of the system 100 may include more or fewer test and measurement instruments 104A-N (i.e., N<4 or N>4). Each of the test and measurement instruments 104 may, for example, be an oscilloscope, and is configured to be coupled to the DUT 106 to receive a plurality of test signals from the DUT during a test mode of operation. In the example embodiment of FIG. 1, the DUT 106 is a test board including one more DDR SDRAMs and the test signals received by the test and measurement instruments 104A-D include data signals DQ0-DQ14 and a data strobe signal DQS. The DUT 106 may include different types of memory devices in some embodiments, and the test signals supplied to the test and measurement instruments 104A-D may include different signals from the one or more DDR SDRAMs of the DUT. For example, in some embodiments the test signals from the DDR SDRAMS of the DUT 106 include command address signals CA and a chip select signal CS.

One of the test and measurement instruments 104A-D is designated as a master test and measurement instrument and the remainder of the test and measurements instruments are designated as extension test and measurement instruments. The test and measurement instrument 104A is the master while the test and measurement instruments 104B-D are the extensions in the test and measurement system 100. The designation as a master or extension configures each of the test and measurement instruments 104A-D to function accordingly as either a master or an extension test and measurement instrument. The test and measurement instrument 104A-D designated as the master, which is the test and measurement instrument 104A in FIG. 1, is configured to communicate control signals to each of the extension test and measurement instruments 104B-D to synchronize all the test and measurement instruments to simultaneously acquire the DQS and DQ0-DQ14 signals provided by the DUT 106.

The communication between the master test and measurement instrument 104A and each of the extension test and measurement instruments 104B-D occurs over a communication link 107 in the test and measurement system 100. In some embodiments, the communication link 107 is the UltraSync multi-unit time synchronization bus by Tektronix. The master test and measurement instrument 104A communicates control signals over the communication link 107 from the master to each of the extension test and measurement instruments 104B-D to synchronize all the instruments. In some embodiments of the test and measurement system 100, the master test and measurement instrument 104A provides over the communication link 107 a sample clock signal for use by each of the test and measurement instruments 104A-D in synchronizing simultaneously acquiring the DQS and DQ signals provided by the DUT 106. The master test and measurement instrument 107 also provides a trigger signal to control starting and stopping of a test cycle, namely starting and stopping the acquiring of the DQS and DQ signals by the test and measurement instruments 104A-D. The master test and measurement instrument also controls the transfer of data over the communication link 107 from each of the extension test and measurement instruments 104B-D to the master test and measurement instrument. The data transferred over the communication link 107 for each of the extension test and measurement instrument corresponds to data for the DQ0-DQ14 signals acquired by the extension test and measurement instruments 104B-D.

Once the test and measurement instruments 104A-D have acquired the DQS and DQ0-DQ14 signals from the DUT 106 in a current test cycle of the test and measurement system 100, each of the extension test and measurement instruments 104B-D supplies the corresponding subset of the DQS and DQ0-DQ14 signals to the master test and measurement instrument 104A. The master test and measurement instrument 104A aggregates the acquired DQ3-14 signals received from the extension test and measurement instruments 104B-D as well as the DQS and DQ0-2 signals acquired by the master test and measurement instrument and supplies these aggregated acquired signals to an automation engine 108 coupled to the multi-stack test subsystem 102. Upon receiving the acquired DQS and DQ0-DQ14 signals from the test and measurement instrument 104A, the automation engine 108 is configured to analyze the acquired DQS and DQ0-DQ14 signals to perform validation testing for each of these signals and to thereafter simultaneously display results of the validation testing for these signals. A user may view these displayed results provided by the automation engine 108 and instantly determine whether the DUT 106 has passed or failed the validation test, and to identify which of the DQS and DQ0-DQ14 signals, if any, have failed the test.

5 | 6

The automation engine 108 executes analysis algorithms 110 to analyze the acquired DQS and DQ0-DQ14 signals. The specific analysis algorithms 110 executed by the automation engine 108 to analyze the acquired DQS and DQ0-DQ14 signals may vary in different embodiments of the test and measurement system 100. A user may view these simultaneously displayed results provided by the automation engine 108 to determine whether each of the DQS and DQ0-DQ14 signals of the DUT 106 has passed or failed the validation test, and also to see various parameters calculated by the analysis algorithms 110 for each of these signals. For example, the automation engine 108 may execute the analysis algorithms 110 to generate an eye diagram for each of the acquired DQS and DQ0-DQ14 signals, and may also determine an eye height, an eye width, and a mask for the generated eye diagrams for each of these signals. In embodiments of the present disclosure, the automation engine 108 can be implemented using one or more processors, and, in different embodiments, the one or more processors may reside on one or more of the plurality of test and measurement instruments 104A-D, or may reside on one or more external computing devices including cloud-based processors, or may be distributed between one or more of the plurality of test and measurement instruments 104A-D and one or more external computing devices.

Figure 2:
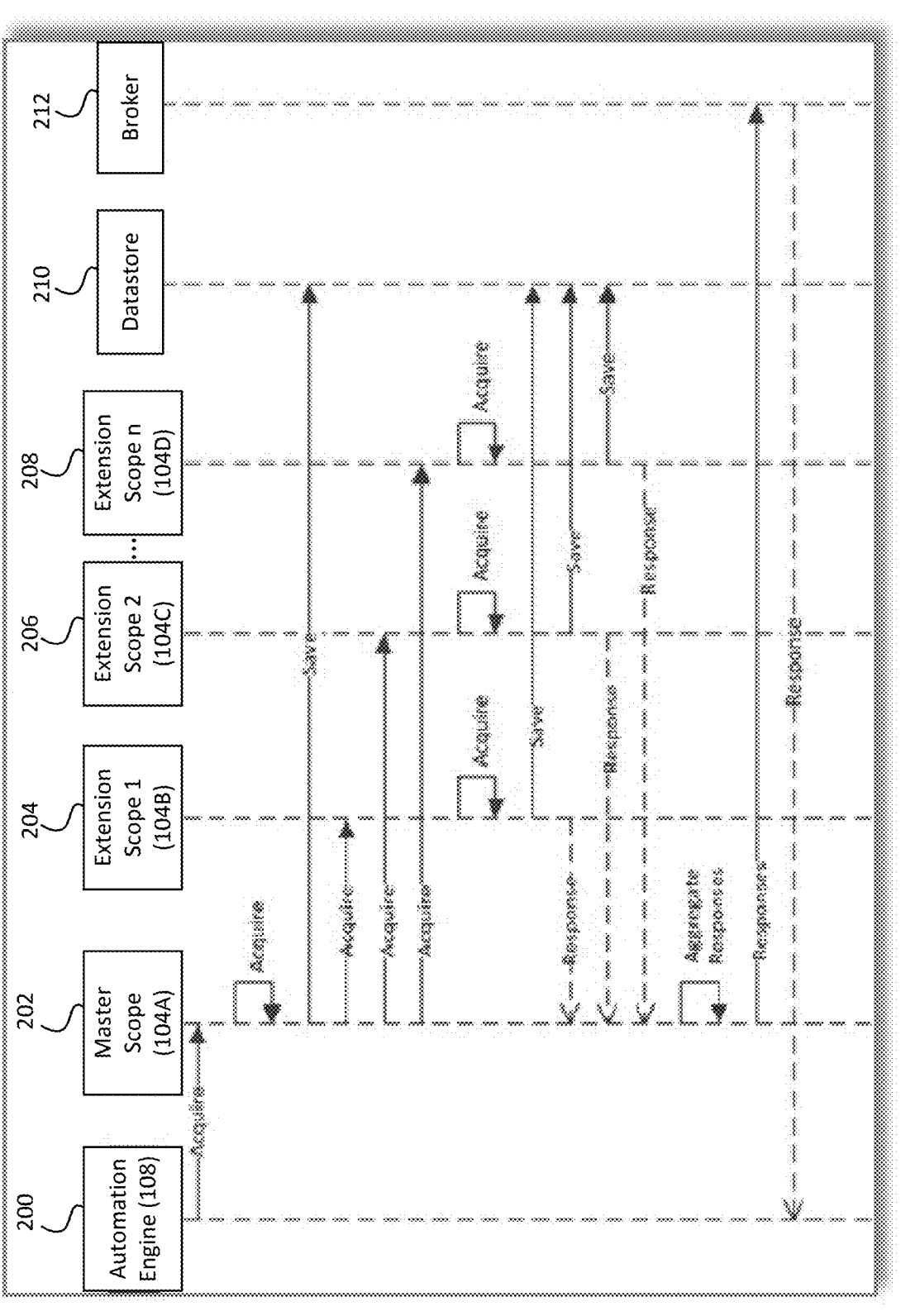
FIG. 2 is a sequence diagram showing a process of operation of components of the test and measurement system of FIG. 1 in accordance with some embodiments of the present disclosure.

FIG. 2 is a sequence diagram showing the sequence of operation of components of the test and measurement system 100 of FIG. 1 in accordance with some embodiments of the present disclosure. The overall operation of the test and measurement system 100 in accordance with some embodiments of the present disclosure will now be described in more detail with reference to FIGS. 1 and 2. To start a test cycle of the DUT 106, the DUT is placed in a validation test mode of operation. This is not expressly shown in FIG. 2 and will vary depending on the type of DUT 106 being tested. Where the DUT is an DDR SDRAM, placing the device into a validation test mode of operation will be understood by those skilled in the art and thus the details are not be described herein. Briefly, in a DDR SDRAM, a typical memory access operation includes an activate command to access a particular row in a particular bank in the memory device, and address bits associated with a read or write command identify a starting column for a burst data transfer from memory cells in the active row. Each burst in the burst data transfer is provided as a corresponding data word on the data bus data signals DQ0-DQ14 and the DQS signal is provided along with the data signals to enable a device receiving the data signals to properly capture or acquire the signals. The DQS signal functions as a differential "burst clock" and is supplied along with the data signals DQ0-DQ14 on a data bus during read and write operations. Data is transferred on both rising and falling edges of the DQS signal and therefore twice each cycle of the DQS signal, thus the double data rate (DDR) designation.

A DDR SDRAM has a data bus that typically includes 8, 16, or 32 data signals DQ. The DQ0-DQ14 of the DUT 106 are used by way of example in the present description and represent an example embodiment where the DUT 106 is a DDR SDRAM having a 16 bit data bus carrying data signals DQ0-DQ15. Each of the test and measurements instruments 104A-104D has four input test ports, which is true for many conventional oscilloscopes. Each test port on the test and measurement instruments 104A-D is configured to be coupled to a test point on the DUT 106 to acquire a test signal provided the DUT on the test point. The DQS signal plus fifteen DQ signals DQ0-DQ14 equals sixteen test signals, which is the number of test ports available on the four test and measurement instruments 104A-104D. This configuration of the DUT 106 is provided merely by way of example, and other configurations can include more or fewer data signals DQ as well as more or fewer test and measurement instruments 104, or test and measurement instruments including more or fewer test ports, in further embodiments of the present disclosure.

Upon being placed in the validation test mode of operation, the DUT 106 begins providing test data patterns for each of the DQ0-DQ14 signals along with the DQS signal. The DQS signal has a frequency that is typically the same as that of a clock signal supplied to the memory device. Typically, the test data pattern for each of DQ0-DQ14 signals is a series of alternating logic zeros and logic ones (e.g., 1010101010 . . . ), or some other pseudorandom bit sequence. At operation 200 in FIG. 2, the automation engine 108 sends an acquire request to the master test and measurement instrument 104A to initiate a test cycle. In response to the acquire request, at operation 202 the master test and measurement instrument 104A sends acquire instructions to the extension test and measurement instruments 104B, 104C, and 104D. In response to the acquire request from the automation engine 108 and the acquire instructions provided by the master test and measurement instrument 104A to the extension test and measurement instruments 104B-D, at operations 202-208 each of the master and extension test and measurement instruments 104A-D acquires the corresponding DQS and DQ0-DQ14 signals provided by the DUT 106. Each test and measurement instrument saves data of the corresponding acquired DQS and DQ0-DQ14 signals to a datastore at operation 210, which represents storage of the corresponding acquired signals by each of the test and measurement instruments 104A-D.

After saving the corresponding acquired DQS and DQ signals, each of the extension test and measurement instruments 104B-D provides a response to the master test and measurement instrument 104A including data corresponding to the acquired signals for that extension test and measurement instrument. The master test and measurement instrument 104A then aggregates the responses from the extension test and measurement instruments 104B-D, which corresponds to data for the acquired DQ3-14 signals, along with data corresponding to the acquired DQS and DQ0-2 signals acquired by the master test and measurement instrument 104A. These aggregated responses from all the test and measurement instruments 104A-D are then provided to a broker at operation 212. The broker may be viewed as being a component of the automation engine 108 of FIG. 1 which functions facilitate the transfer of the aggregated responses from the master test and measurement instrument 104A and provide these aggregated responses to the automation engine 108. In the automation engine 108, the aggregated responses are provided to the analysis algorithms 110 for analyzing to perform validation testing of the acquired DQS and DQ signals.

FIG. 3 shows example eye diagrams of data signals DQ0-7 and data strobe signal DQS acquired by the multistack test subsystem 102 and displayed by the automation engine 108 of the test and measurement system 100 of FIG. 1 in accordance with some embodiments of the present disclosure. Only eye diagrams for the data signals DQ0-DQ7 are shown in FIG. 3, with data signals DQ8-DQ14 being omitted merely to simply the figures. The eye diagrams show voltage along the vertical axis and time along the horizontal axis for each signal. These eye diagrams are examples of displays generated by the automation engine 108 of FIG. 1 which provide a user with simultaneous information about validation test results for the DQ0-DQ7 and DQS signals acquired from the DUT 106 during validation testing. FIG. 3 shows an eye diagram for each of the data signals DQ0-DQ7 along with an eye mask for each of these signals, and also shows the eye diagram for the DQS signal. An eye diagram is generated by repetitively acquiring a digital signal over multiple time intervals and then overlaying these multiple acquisitions of the digital signal. An eye mask defines acceptable limits for the eye diagram, and effectively shows an "impermissible region" such that if any portion of the eye diagram is present in the eye mask, then validation of the signal fails. Eye diagrams and eye masks of digital signals are well understood to those skilled in the art and thus are not described in detail herein.

In the upper left of FIG. 3, an eye diagram 300 for the DQ0 signal is shown along with an eye mask 302 for the DQ0 signal and also shown is an eye diagram 304 for the DQS signal. Only the eye patterns 300, 304 and eye mask 302 (RxMask) for the data signal DQ0 are labelled in FIG. 3 to simplify the figure. The display of these eye diagrams provides a user with a visual representation of the validation test results for each DQ0-7 signal and the DQS signal being tested, allowing the user to more closely examine characteristics of each of these signals and examine reasons for failure of any signals, such as presence of a portion of the eye diagram 300 of the DQ0 signal in the eye mask 302. No failures are present in any of the eye diagrams illustrated in FIG. 3. FIG. 3 also shows eye diagrams for the data signals DQ0-7 along with the eye diagram for the DQS signal and illustrates an eye height parameter EH for each of these eye diagrams. FIG. 3 also shows eye diagrams for the data signals DQ0-7 along with the eye diagram for the DQS signal and illustrates an eye width parameter EW for each of these eye diagrams. In some embodiments, the automation engine 108 may generate separate displays showing eye diagrams illustrating the eye mask 302 (RxMask), eye height parameter EH, and eye width parameter EW for each of the DQ0-7 signals.

FIGS. 4A-4C are exploded eye diagrams of selected ones of eye diagrams of FIG. 3 to more clearly show eye diagram parameters that may be calculated by the analysis algorithms 110 of the automation engine 108 for the each of the DQ0-DQ14 and DQS signals captured from the DUT 106 of FIG. 1 in accordance with some embodiments of the present disclosure. FIGS. 4A-4C specifically show eye diagrams for the DQ0 signal. Once again, these eye diagrams show voltage along the vertical axis and time along the horizontal axis for each signal. FIG. 4A shows the eye diagram 400 for the DQ0 signal along with the eye diagram 402 for the DQS signal. The eye height EH parameter of the eye diagram 400 is shown and gives the range between the lowest and highest measured voltages of an eye opening of the DQ0 signal, where the eye opening of a signal is defined by the vertical eye height EH parameter and a horizontal eye width EW parameter as shown in FIG. 4B. FIG. 4B shows the eye diagram 400 for the DQ0 signal along with the eye diagram 402 for the DQS signal, and the eye width EW of the eye diagram 400 showing the duration of the eye opening of the eye diagram. FIG. 4C shows the eye mask EM (i.e., RxMask) of the eye diagram 400, which as described above effectively corresponds to a forbidden region for the eye diagram 400 of the DQ0 signal. If any portion of the eye diagram 400 is present in the eye mask EM, validation of the DQ0 signal has failed.

FIG. 5 illustrates eye diagrams 500-DQ0 to 500-DQ7 for each of the DQ0-DQ7 signals, along with the eye diagram of the DQS signal 502 (only labelled in the top diagram).

Only DQ0-DQ7 signals are shown and not all DQ0-DQ14 in order to simply the figure. Voltage is indicated on the vertical axis and time on the horizontal axis in each diagram of FIG. 5. FIG. 5 illustrates skew between the DQS signal and each of the eye diagrams 500-DQ0 to 500-DQ7 to enable a worst-case skew to be identified. The transition of the DQS signal is indicated by the vertical line 504 in FIG. 5, with skew of each DQ0-DQ7 signal being defined by the time difference between the time at vertical line 504 and the transition of the corresponding DQ0-DQ7 signal as indicated in the corresponding eye diagram 500-DQ0 to 500-DQ7. In this example, the worst-case skew occurs between the DQS signal and eye diagram 500-DQ6 while the shortest skew occurs with eye diagram 500-DQ2. In some embodiments, the analysis algorithms 110 executed by the automation engine 108 of FIG. 1 also calculates a skew offset defined as the magnitude of the difference between the shortest skew and the longest skew. Once again, the display of the eye diagrams 500-DQ0 to 500-DQ7 allows a user to simultaneously view the validation test results for all the DQ and DQS signals from the DUT 106 and quickly assess the validation test results based on these visual presentations.

FIGS. 6-8 illustrate several exemplary graphical displays generated by the automation engine 108 of FIG. 1 in executing the analysis algorithms 110 in accordance with some embodiments of the present disclosure. These graphical displays are provided by way of example to illustrate the type of validation test information the automation engine 108 may provide to a user to visually indicate whether parameters calculated for the DQS and DQ0-DQ14 signals captured from the DUT 106 pass or fail associated test criteria analyzed by the analysis algorithms 110. FIG. 6 illustrates an input voltage swing VIHLAc for the DQ signals, a high value for an input pulse width TdiPW_High of a DQ signal and a low value for the input pulse width diPW_Low, along with a slew rate SRIN-diVW_Rise for a rising edge of the DQ signals. FIGS. 7 and 8 illustrate tables showing skew values calculated between respective ones of the DQ signals the DQS signal, as discussed above in relation to FIG. 5. FIG. 7 shows the skew values, in picoseconds, in the second column for the DQ0-DQ5 signals. FIG. 8 shows the skew values for the DQ3-DQ7 signals. In comparing the skew values shown in the tables of FIGS. 7 and 8, it is seen that the largest skew value of 601.64087676 picoseconds (ps) occurs for the DQ6 signal. The shortest skew value of 560.77103533 ps for DQ2 is shown in FIG. 5. A skew offset parameter tDQ2DQ equal to 40.8698414 ps is shown in FIG. 8 and corresponds to the magnitude of the difference between the shortest and longest skew values (i.e., (601.64087676 ps−560.77103533 ps)=40.8698414 ps).

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. A configuration of the technologies may include any one or more, and any combination of, the examples described below.

Example 1 is a method for testing a device under test (DUT) in a test and measurement system. The method includes placing the DUT in a test mode of operation, the DUT providing a plurality of test signals during operation in the test mode, synchronizing a plurality of test and measurement instruments, each of the plurality of test and measurement instruments coupled to the DUT to receive selected ones of the plurality of test signals, simultaneously acquiring, by the synchronized plurality of test and measurement instruments, the plurality of test signals provided by the DUT, analyzing the acquired plurality of test signals to perform validation testing for each of plurality of test signals, and simultaneously displaying results of the validation testing for each of the plurality of test signals.

Example 2 is a method according to Example 1, wherein the test signals comprise a plurality of data signals and a data strobe signal.

Example 3 is a method according to Example 1, wherein the test signals comprise a plurality of command address signals and a chip select signal.

Example 4 is a method according to any of the preceding Example methods, wherein the DUT is a double data rate (DDR) memory.

Example 5 is a method according to any of the preceding Example methods, wherein each of the plurality of test and measurement instruments comprises an oscilloscope.

Example 6 is a method according to any of the preceding Example methods, wherein simultaneously acquiring, by the plurality of test and measurement systems, the plurality of test signals provided by the DUT further comprises generating an eye diagram for each of the plurality of test signals.

Example 7 is a method according to any of the preceding Example methods, wherein analyzing the acquired plurality of test signals further comprises determining an eye height, an eye width, and a mask for the generated eye diagrams for each of the plurality of test signals.

Example 8 is a method according to any of the preceding Example methods, wherein simultaneously displaying results of the validation testing further comprises displaying the generated eye diagrams and determined eye height, eye width, and mask for each of the plurality of test signals.

Example 9 is a method according to any of the preceding Example methods, wherein simultaneously displaying results of the validation testing further comprises displaying, for the plurality of test signals, an indication whether the test signal waveform has passed or failed the validation testing.

Example 10 is a method according to any of the preceding Example methods, wherein synchronizing the plurality of test and measurement instruments includes designating one of the plurality of test and measurement instruments as a master test and measurement instrument and the remainder of the plurality of test and measurements instruments as extension test and measurement instruments, and communicating control signals from the master test and measurement instrument to each of the plurality of extension test and measurement instruments to control the simultaneous acquiring of the plurality of test signals provided by the DUT.

Example 11 is a method according to Example 10, wherein communicating control signals from the master test and measurement instrument to each of the plurality of extension test and measurement instruments includes providing, by the master test and measurement instrument, a sample clock signal for use in synchronizing simultaneously acquiring the plurality of test signals provided by the DUT by the plurality of test and measurement instruments, providing a trigger signal to control starting and stopping of acquiring the plurality of test signals by the plurality of test and measurement instruments, and controlling the transfer of data from each of the plurality extension test and measurement instruments to the master test and measurement instrument, the transferred data for each of the plurality of extension test and measurements instruments corresponding to data for the plurality of test signals acquired by the extension test and measurement instrument.

Example 12 is a test and measurement system according to Example 11, including a multi-stack test subsystem including a plurality of test and measurement instruments, each of the plurality of test and measurement instruments configured to be coupled to a device under test (DUT) to receive a plurality of test signals from the DUT during a test mode of operation, one of the plurality of test and measurement instruments being designated as a master test and measurement instrument and the remainder of the plurality of test and measurements instruments being designated as extension test and measurement instruments, the master test and measurement instrument configured to communicate control signals to each of the plurality of extension test and measurement instruments to synchronize the plurality of test and measurement instruments to simultaneously acquire the plurality of test signals provided by the DUT, and an automation engine coupled to the multi-stack test subsystem to receive the acquired plurality of test signals from the master one of the plurality of test and measurement instruments, the automation engine configured to analyze the acquired plurality of test signals to perform validation testing for each of the plurality of test signals and simultaneously display results of the validation testing for the plurality of test signals.

Example 13 is a test and measurement system according to Example 12, wherein the DUT is a double data rate (DDR) memory.

Example 14 is a is a test and measurement system according to Example 13, wherein the test signals comprise a plurality of data signals and a data strobe signal.

Example 15 is a is a test and measurement system according to Example 13, wherein the test signals comprise a plurality of command address signals and a chip select signal.

Example 16 is a is a test and measurement system according to any of the preceding Example test and measurement systems, wherein each of the plurality of test and measurement instruments comprises an oscilloscope.

Example 17 is a test and measurement system according to any of the preceding Example test and measurement systems, wherein the automation engine is configured to generate an eye diagram for each of the acquired plurality of test signals.

Example 18 is a test and measurement system according to any of the preceding Example test and measurement systems, wherein the automation engine is configured to determine an eye height, an eye width, and a mask for the generated eye diagrams for the plurality of test signals.

Example 19 is a test and measurement system including a multi-stack test subsystem, including a plurality of extension test and measurement instruments, each test and measurement instrument configured to be coupled to a device under test (DUT) to receive a plurality of test signals from the DUT during a validation test mode of operation, a master test and measurement instrument coupled to the plurality of extension test and measurement instruments, the master test and measurement instrument configured to be coupled to the DUT to receive a plurality of test signals from the DUT during the validation test mode of operation, and the master test and measurement instrument further configured to communicate control signals to each of the plurality of extension test and measurement instruments to synchronize the plurality of test and measurement instruments to simultaneously acquire the plurality of test signals provided by the DUT, and an automation engine coupled to the multi-stack test subsystem to receive the acquired plurality of test signals from the master one of the plurality of test and measurement instruments, the automation engine configured to analyze the acquired plurality of test signals to perform validation testing for each of plurality of test signals and simultaneously display results of the validation testing for the plurality of test signals.

Example 20 is a test and measurement system of Example 19, wherein the master test and measurement instrument is configured to communicate control signals including a sample clock signal for use in synchronizing simultaneously acquiring the plurality of test signals provided by the DUT by the plurality of test and measurement instruments; a trigger signal to control starting and stopping of acquiring the plurality of test signals by the plurality of test and measurement instruments; and signals to control transfer of data from each of the plurality of extension test and measurement instruments to the master test and measurement instrument, the transferred data for each of the plurality of extension test and measurements instruments corresponding to data for the plurality of test signals acquired by the extension test and measurement instrument.

The foregoing description has been set forth merely to illustrate example embodiments of present disclosure and is not intended to be limiting. Since modifications of the disclosed embodiments incorporating the substance of the invention may occur to person skilled in the art, the invention should be construed to include everything within the scope of the invention.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that all features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:
1. A method for testing a device under test (DUT) in a test and measurement system, comprising:

placing the DUT in a test mode of operation, the DUT providing a plurality of test signals during operation in the test mode;

synchronizing a plurality of test and measurement instruments, each of the plurality of test and measurement instruments coupled to the DUT to receive selected ones of the plurality of test signals;

simultaneously acquiring, by the synchronized plurality of test and measurement instruments, the plurality of test signals provided by the DUT;

analyzing the acquired plurality of test signals to perform validation testing for each of plurality of test signals; and simultaneously displaying results of the validation testing for each of the plurality of test signals, wherein each of the plurality of test and measurement instruments comprises an oscilloscope.

2. The method of claim 1, wherein the test signals comprise a plurality of data signals and a data strobe signal.

3. The method of claim 1, wherein the test signals comprise a plurality of command address signals and a chip select signal.

4. The method of claim 1, wherein the DUT is a double data rate (DDR) memory.

5. The method of claim 1, wherein simultaneously acquiring, by the plurality of test and measurement instruments, the plurality of test signals provided by the DUT further comprises generating an eye diagram for each of the plurality of test signals.

6. The method of claim 5, wherein analyzing the acquired plurality of test signals further comprises determining an eye height, an eye width, and a mask for the generated eye diagrams for each of the plurality of test signals.

7. The method of claim 6, wherein simultaneously displaying results of the validation testing further comprises displaying the generated eye diagrams and determined eye height, eye width, and mask for each of the plurality of test signals.

8. The method of claim 1, wherein simultaneously displaying results of the validation testing further comprises displaying, for the plurality of test signals, an indication whether the test signal waveform has passed or failed the validation testing.

9. The method of claim 1, wherein synchronizing the plurality of test and measurement instruments comprises:

designating one of the plurality of test and measurement instruments as a master test and measurement instrument and the remainder of the plurality of test and measurements instruments as extension test and measurement instruments; and communicating control signals from the master test and measurement instrument to each of the plurality of extension test and measurement instruments to control the simultaneous acquiring of the plurality of test signals provided by the DUT.

10. The method of claim 9, wherein communicating control signals from the master test and measurement instrument to each of the plurality of extension test and measurement instruments comprises:

providing, by the master test and measurement instrument, a sample clock signal for use in synchronizing simultaneously acquiring the plurality of test signals provided by the DUT by the plurality of test and measurement instruments;

providing a trigger signal to control starting and stopping of acquiring the plurality of test signals by the plurality of test and measurement instruments; and controlling the transfer of data from each of the plurality of extension test and measurement instruments to the master test and measurement instrument, the transferred data for each of the plurality of extension test and measurements instruments corresponding to data for the plurality of test signals acquired by the extension test and measurement instrument.

11. A test and measurement system, comprising:

a multi-stack test subsystem including a plurality of test and measurement instruments, each of the plurality of test and measurement instruments configured to be coupled to a device under test (DUT) to receive a plurality of test signals from the DUT during a test mode of operation, one of the plurality of test and measurement instruments being designated as a master test and measurement instrument and the remainder of the plurality of test and measurements instruments being designated as extension test and measurement instruments, the master test and measurement instrument configured to communicate control signals to each of the plurality of extension test and measurement instruments to synchronize the plurality of test and measurement instruments to simultaneously acquire the plurality of test signals provided by the DUT; and an automation engine coupled to the multi-stack test subsystem to receive the acquired plurality of test signals from the master one of the plurality of test and measurement instruments, the automation engine configured to analyze the acquired plurality of test signals to perform validation testing for each of the plurality of test signals and simultaneously display results of the validation testing for the plurality of test signals, wherein each of the plurality of test and measurement instruments comprises an oscilloscope.

12. The test and measurement system of claim 11, wherein the DUT is a double data rate (DDR) memory.

13. The test and measurement system of claim 12, wherein the test signals comprise a plurality of data signals and a data strobe signal.

14. The test and measurement system of claim 12, wherein the test signals comprise a plurality of command address signals and a chip select signal.

15. The test and measurement system of claim 11, wherein the automation engine is configured to generate an eye diagram for each of the acquired plurality of test signals.

16. The test and measurement system of claim 15, wherein the automation engine is configured to determine an eye height, an eye width, and a mask for the generated eye diagrams for the plurality of test signals.

17. A test and measurement system, comprising:

a multi-stack test subsystem, including:

a plurality of extension oscilloscopes, each oscilloscope configured to be coupled to a device under test (DUT) to receive a plurality of test signals from the DUT during a validation test mode of operation;

a master oscilloscope coupled to the plurality of extension oscilloscopes, the master oscilloscope configured to be coupled to the DUT to receive a plurality of test signals from the DUT during the validation test mode of operation, and the master oscilloscope further configured to communicate control signals to each of the plurality of extension oscilloscopes to synchronize the plurality oscilloscopes to simultaneously acquire the plurality of test signals provided by the DUT; and an automation engine coupled to the multi-stack test subsystem to receive the acquired plurality of test signals from the master oscilloscope, the automation engine configured to analyze the acquired plurality of test signals to perform validation testing for each of plurality of test signals and simultaneously display results of the validation testing for the plurality of test signals.

18. The test and measurement system of claim 17, wherein the master oscilloscope is configured to communicate control signals including:

a sample clock signal for use in synchronizing simultaneously acquiring the plurality of test signals provided by the DUT by the plurality of oscilloscopes;

a trigger signal to control starting and stopping of acquiring the plurality of test signals by the plurality of oscilloscopes; and signals to control transfer of data from each of the plurality of extension oscilloscopes to the master oscilloscope, the transferred data for each of the plurality of extension oscilloscopes corresponding to data for the plurality of test signals acquired by the extension oscilloscopes.

\* \* \* \* \*